(12) United States Patent
Matsui et al.

(10) Patent No.: US 7,922,918 B2
(45) Date of Patent: Apr. 12, 2011

(54) METHOD OF MANUFACTURING CIRCUIT BOARD USED FOR SWITCH DEVICE

(75) Inventors: Yasuo Matsui, Miyagi-ken (JP); Shunji Araki, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 728 days.

(21) Appl. No.: 11/872,215

(22) Filed: Oct. 15, 2007

(65) Prior Publication Data
US 2008/0093335 A1    Apr. 24, 2008

(30) Foreign Application Priority Data
Oct. 18, 2006    (JP) .................................. 2006-284097

(51) Int. Cl.
*H01B 13/00*    (2006.01)
(52) U.S. Cl. ................. 216/13; 216/18; 216/88; 29/846; 29/849; 174/250
(58) Field of Classification Search .................... 216/13, 216/138, 88; 29/846, 849; 174/250
See application file for complete search history.

(56) References Cited

U.S. PATENT DOCUMENTS

| | | | | |
|---|---|---|---|---|
| 3,914,161 A | * | 10/1975 | Yonezawa et al. | 205/238 |
| 4,403,211 A | * | 9/1983 | Shibata et al. | 340/476 |
| 4,644,115 A | * | 2/1987 | Nishimori et al. | 200/409 |
| 4,687,545 A | * | 8/1987 | Williams et al. | 216/107 |
| 6,707,158 B2 | * | 3/2004 | Nose | 257/777 |
| 2002/0112947 A1 | * | 8/2002 | Shibata et al. | 200/61.54 |
| 2003/0194485 A1 | * | 10/2003 | Rhee et al. | 427/98 |

FOREIGN PATENT DOCUMENTS

| | | |
|---|---|---|
| GB | 877674 | 9/1961 |
| JP | 06-077277 | 10/1991 |
| JP | 7-326844 A | 12/1995 |
| JP | 11-214115 A | 8/1999 |
| JP | 2970537 | 8/1999 |
| JP | 2000-188028 | 7/2000 |

OTHER PUBLICATIONS

Search Report issued in corresponding European Patent Application No. 07 02 0024; issued Jul. 1, 2009.

* cited by examiner

*Primary Examiner* — Shamim Ahmed
(74) *Attorney, Agent, or Firm* — Brinks Hofer Gilson & Lione

(57) ABSTRACT

There is provided a method of manufacturing a circuit board having a first fixed contact and a second fixed contact that extend substantially orthogonal to each other on the same surface, the life span required for the first fixed contact being longer than that required for the second fixed contact. The method includes: etching a copper foil formed on the entire surface of an insulating substrate to form the patterns of the first and second fixed contacts; polishing the surface of the insulating substrate with buff to remove an oxide film adhered to the copper foil; and sequentially forming a nickel layer having a thickness of about 1 to about 5 μm and a gold layer having a thickness of about 0.01 to about 0.5 μm on each of the first and second fixed contacts. In the method, the buffing direction is substantially aligned with a direction in which a first movable contact slides on the first fixed contact.

4 Claims, 8 Drawing Sheets

METHOD OF MANUFACTURING CIRCUIT BOARD USED FOR SWITCH DEVICE

CLAIM FOR PRIORITY

This application claims benefit of the Japanese Patent Application No. 2006-284097 filed on Oct. 18, 2006, which is hereby incorporated by reference.

BACKGROUND OF THE INVENTION

1. Field of the Invention

The present invention relates a method of manufacturing a circuit board used for various switch devices, and more particularly, to a method of manufacturing a circuit board used for a slide-type switch device in which a movable contact slides on a fixed contact.

2. Description of the Related Art

In general, in a method of manufacturing a circuit board used for a slide-type switch device, first, a copper-clad insulating substrate formed by cladding one surface or both surfaces of an epoxy resin containing glass with copper is prepared, and the copper foil is etched to form fixed contact and lead conductor patterns. Then, a solder resist is coated on a specific region on the insulating substrate except for the fixed contact, and a nickel layer (a thickness of about 2 μm) and a silver layer (a thickness of about 5 μm) are sequentially formed on the fixed contact by plating. In this manufacturing method, when an oxide film remains on the surface of the copper foil during the etching process and the process of coating the solder resist, the adhesion of a resist or a solder resist used for etching is considerably reduced. Therefore, a process of polishing the surface of the copper foil with buff is additionally performed before the etching process and the solder resist coating process to remove the oxide film from the surface of the copper foil (for example, see Japanese Utility Model Application Laid-Open No. 6-77277).

In the circuit board manufactured through the above-mentioned processes, since the total sum of the thicknesses of the nickel layer (base layer) and the silver layer formed on the copper foil, which is a raw material forming the fixed contact, is about 7 μm, it is possible to planarize the silver layer, which is the uppermost layer of the fixed contact. Thus, this to lengthens the life span of the fixed contact and a movable contact sliding thereon. However, this structure has a problem in that the silver layer is sulfurized, which may cause the reliability of electrical connection to be lowered. Therefore, a switch device requiring a long life span and high reliability, for example, a switch device for a vehicle-mounted turn signal switch or steering switch that needs to be used hundreds of thousands of times is plated with gold, instead of silver. In this case, a gold layer is formed on the nickel layer, which is a base layer, with a predetermined thickness by plating. However, since gold is considerably more expensive than silver and has high malleability, the thickness of the gold layer is generally set to about 0.05 μm.

As described above, in the circuit board having the gold layer as the uppermost layer of the fixed contact, since the uppermost layer of the fixed contact is plated with gold, the reliability of electrical connection is improved, but a sufficiently long life span is not obtained. The inventors' study proved that a strip-shaped uneven portion occurs in the surface of the gold layer, and when the sliding direction of a movable contact is orthogonal to the direction in which the uneven portion extends, the abrasion loss of the fixed contact and the movable contact increases due to the uneven portion. The uneven portion occurs in the surface of the gold layer due to scars occurring in the surface of the copper foil during a polishing process using buff. That is, in a thick laminated structure of the nickel layer and the silver layer having a thickness of about 7 μm, since a thick nickel layer is formed on the uneven portion occurring due to the scars caused by the buffing process, little unevenness occurs in the surface of the uppermost layer. However, in a thin gold layer having a thickness of about 2 μm, unevenness occurs in the surface of the gold layer due to the scars occurring in the surface of the copper foil during the buffing process. This is because, regardless of the direction in which the surface extends, a plated layer tends to be substantially uniformly formed in a direction orthogonal to the surface and the gap between the surfaces of both sides of one concave portion becomes narrower when the plated layer is formed. In particular, when new buff having a sharp leading end is used, the depth of the scars caused by the buffing process increases, which causes the depth of an uneven portion occurring in the surface of the gold layer to increase. As a result, the abrasion of the fixed contact or the movable contact is accelerated.

SUMMARY

A method is provided for manufacturing a circuit board having fixed contacts on which a movable contact slides. The method includes: etching a copper foil formed on the entire surface of an insulating substrate to form the pattern of the fixed contact; polishing the surface of the copper foil with buff, and sequentially forming a nickel layer having a thickness of about 1 to about 5 μm and a gold layer having a thickness of about 0.01 to about 0.5 μm on the fixed contacts. The buffing direction is substantially aligned with a sliding direction of the movable contact.

Further, in order to achieve the above-mentioned object, according to another aspect of the invention, there is provided a method of manufacturing a circuit board having first and second fixed contacts formed on the same surface, in which first and second movable contacts respectively slide on the first and second fixed contacts so as to be substantially orthogonal to each other. The method includes: etching a copper foil formed on the entire surface of an insulating substrate to form the patterns of the first and second fixed contacts; polishing the surface of the copper foil with buff; and sequentially forming a nickel layer having a thickness of about 1 to about 5 μm and a gold layer having a thickness of about 0.01 to about 0.5 μm on each of the first and second fixed contacts. In the method, the buffing direction is substantially aligned with a direction in which the first movable contact slides on the first fixed contact.

DESCRIPTION OF THE EMBODIMENTS

Figure 1:
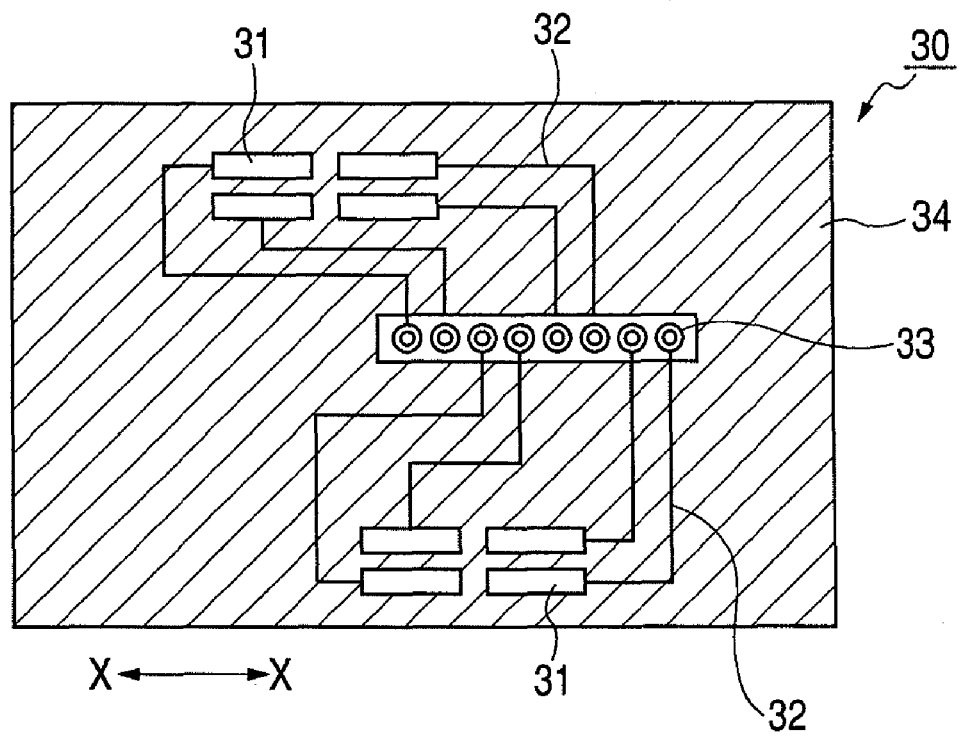
FIG. 1 is a plan view illustrating a circuit board according to a first embodiment.
Figure 2:
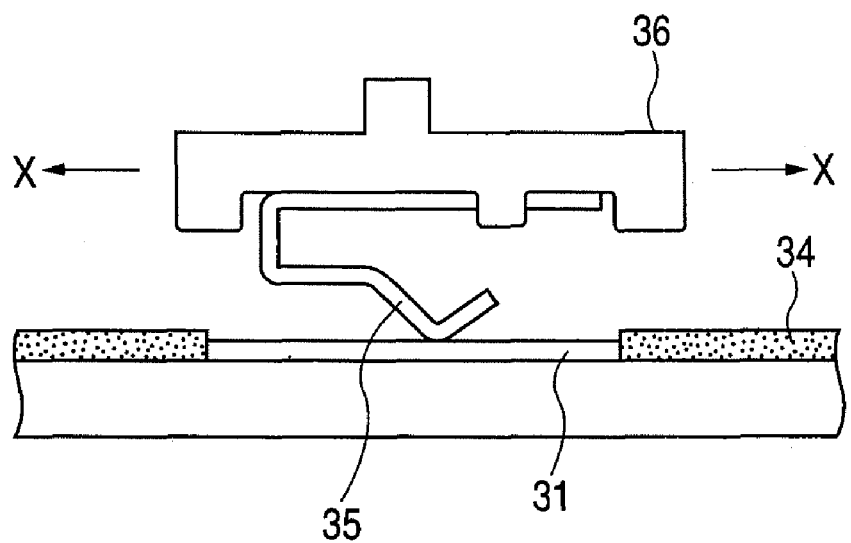
FIG. 2 is a diagram illustrating contact between the circuit board and a movable contact.
Figure 3:
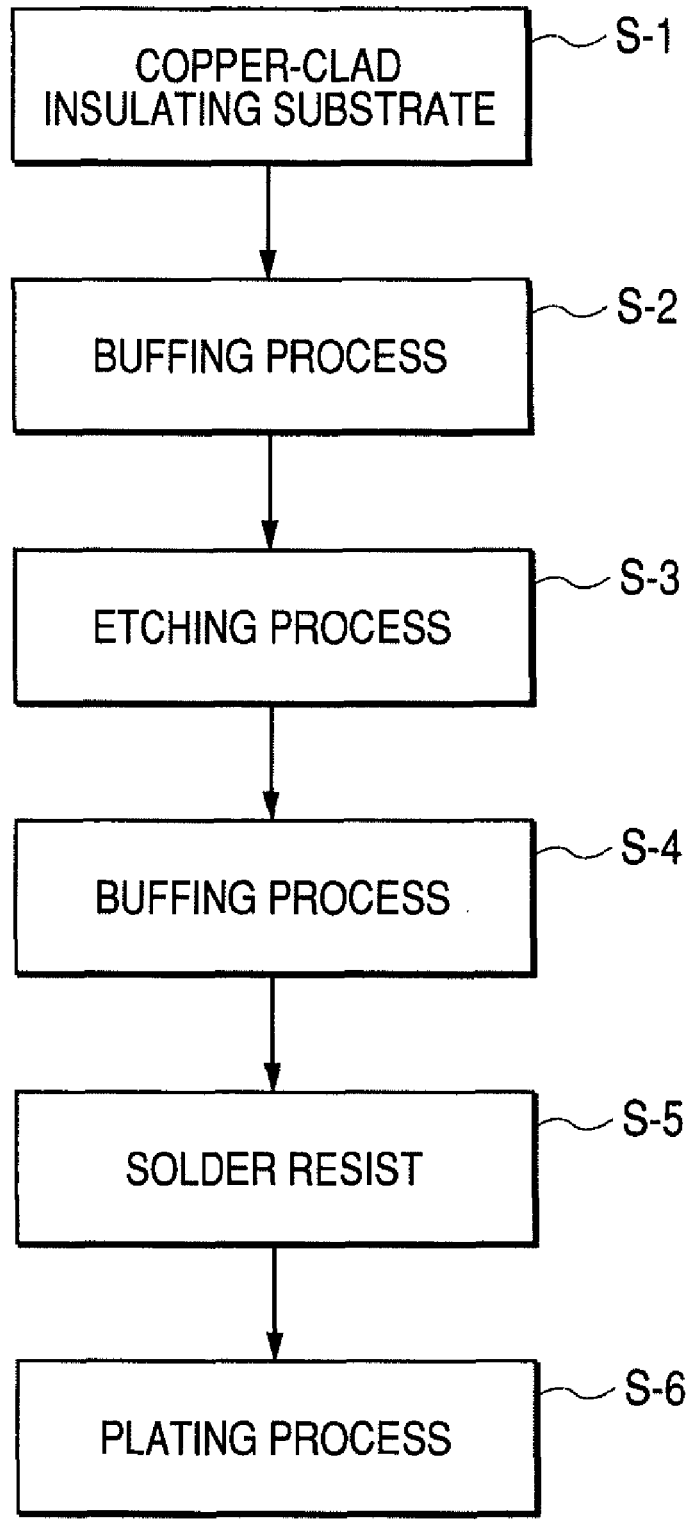
FIG. 3 is a flow chart illustrating a process of manufacturing the circuit board.

Hereinafter, exemplary embodiments of the invention will be described with reference to the accompanying drawings. FIG. 1 is a plan view illustrating a circuit board according to a first embodiment. FIG. 2 is a diagram illustrating contact between the circuit board and a movable contact. FIG. 3 is a flow chart illustrating a process of manufacturing the circuit board. FIG. 4 is a diagram illustrating a polishing process using buff of FIG. 3.

As show in FIG. 1, a plurality of fixed contacts 31 extending in an X-X direction of FIG. 1, lead conductors 32 extending from the fixed contacts 31, and terminals 33 connected to ends of the lead conductors 32 are formed in a pattern on a circuit board 30 according to the first embodiment. A non-contact region except for the fixed contacts 31 and the terminals 33 is covered with a solder resist 34 that is formed of an insulating material. Each of the fixed contacts 31 is formed by plating a cooper foil with nickel and then plating the nickel-plated layer with gold (pure gold), and the uppermost gold layer serves as a sliding contact surface with a movable contact, which will be described later. As shown in FIG. 2, a movable contact 35 is provided on a lower surface of a sliding-element supporting member 36 by, for example, caulking. The sliding-element supporting member 36 is moved on the circuit board 30 in the X-X direction such that the movable contact 35 slides on the surface of the fixed contacts 31. In addition, the movable contact 35 is formed by cladding one surface of an elastic metal plate formed of phosphor bronze with a gold alloy. In this embodiment, the movable contact 35 is formed of a gold alloy containing 75% or more of precious metal, such as gold or platinum (for example, a quinary alloy of Au, Pt, Ag, Ni, and Cu), considering corrosion resistance and hardness.

Figure 4A:
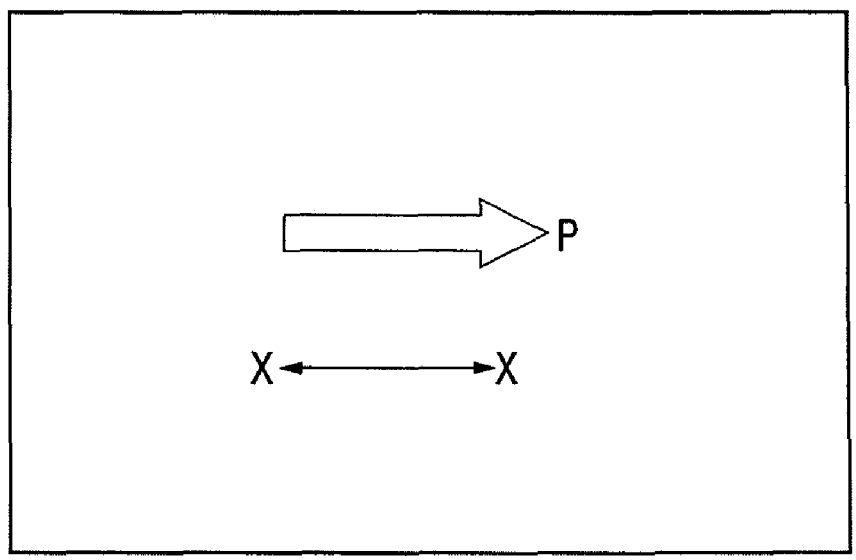
FIG. 4 is a diagram illustrating a buffing process of FIG. 3.
Figure 4B:
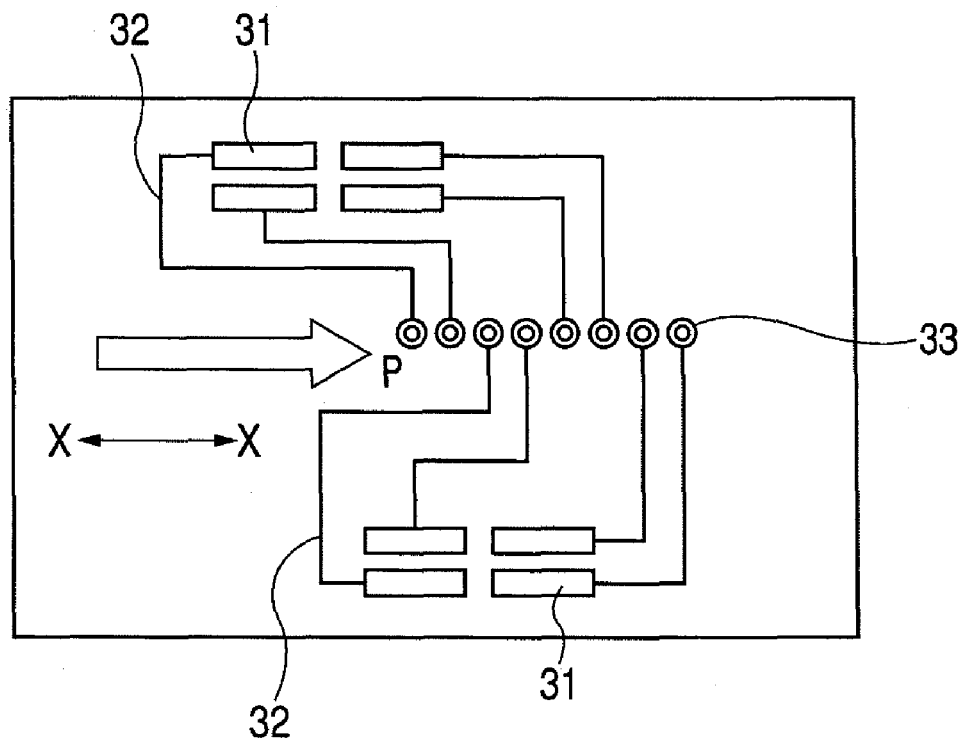

Next, a process of manufacturing the circuit board 30 having the above-mentioned structure will be described with reference to FIG. 3. First, a copper-clad insulating substrate formed by cladding one surface or both surfaces of an epoxy resin containing glass with copper is prepared (S-1), and the surface of the copper-clad insulating substrate is polished with buff to remove an oxide film from the surface of the cooper foil (S-2). As shown in FIG. 4A, in the buffing process, when buffing is performed in the direction of an arrow P, the buffing direction P is aligned with the X-X direction, which is the sliding direction of the movable contact 35. Then, a resist is coated on the entire surface of the cooper foil, and the coated resist is partially exposed and removed. Then, the copper foil is etched in a desired shape, thereby forming the patterns of the fixed contacts 31, the lead conductors 32, and the terminals 33 (S-3). Subsequently, the surface of the copper-clad insulating substrate is polished with buff to remove an oxide film adhered on the surface of the copper foil (the fixed contacts 31 or the terminals 33) (S-4). As shown in FIG. 4B, in the buffing process, the buffing direction P is aligned with the X-X direction, which is the sliding direction of the movable contact 35. Then, a solder resist 34a is coated on a specific region on the insulating substrate except for the fixed contacts 31 and the terminals 33 (S-5), and a nickel layer having a thickness of about 2 µm and a gold layer having a thickness of about 0.05 µm are sequentially formed on the fixed contacts 31s and the terminals 33 by plating (S-6).

Since the uppermost layer of the copper foil, which is a raw material forming the fixed contacts 31, is plated with gold, the circuit board 30 manufactured through the above-mentioned processes has a contact structure having high environmental characteristics including a measure to sulfurization. In addition, since the buffing direction P is aligned with the sliding direction of the movable contact 35 during the buffing processes (S-2 and S-4), an uneven portion that occurs in the surface of the gold layer due to the buffing process in the subsequent plating process (S-6) does not cause the scraping of the movable contact 35 or the fixed contact 31. Therefore, it is possible to improve the reliability of electrical connection by plating the fixed contacts 31 with gold, and it is also possible to reduce the abrasion loss of the fixed contacts 31 or the movable contacts 35, which results in a long life span. In addition, since a nickel layer having a thickness of about 1 µm or less cannot sufficiently serve as a base layer, the nickel layer may have a thickness of about 1 to about 5 µm, preferably, about 2 µm. Since gold used for gold plating is expensive and has high malleability, the gold layer may have a thickness of about 0.01 to about 0.5 µm, preferably, about 0.05 µm.

In this embodiment, the fixed contacts 31 are plated with pure gold, and the movable contact 35 is plated with a gold alloy. Therefore, the hardness of the movable contact 35 is higher than the hardness of the fixed contact 31. This is because, when the movable contact 35 moves, a contact point on the fixed contact 31 with the movable contact 35 is changed, but a contact point on the movable contact 35 with the fixed contact 31 is not changed. In addition, since it is difficult to mix gold with impurities in the gold plating, in this embodiment, the fixed contact 31 is plated with pure gold, and the movable contact 35 is formed of a clad material. However, the invention is not limited thereto, but the fixed contact may be formed of a material containing 0.1% to several percent of additive, such as cobalt, nickel, silver, or indium to improve the hardness, and the movable contact may be plated with gold.

Figure 5:
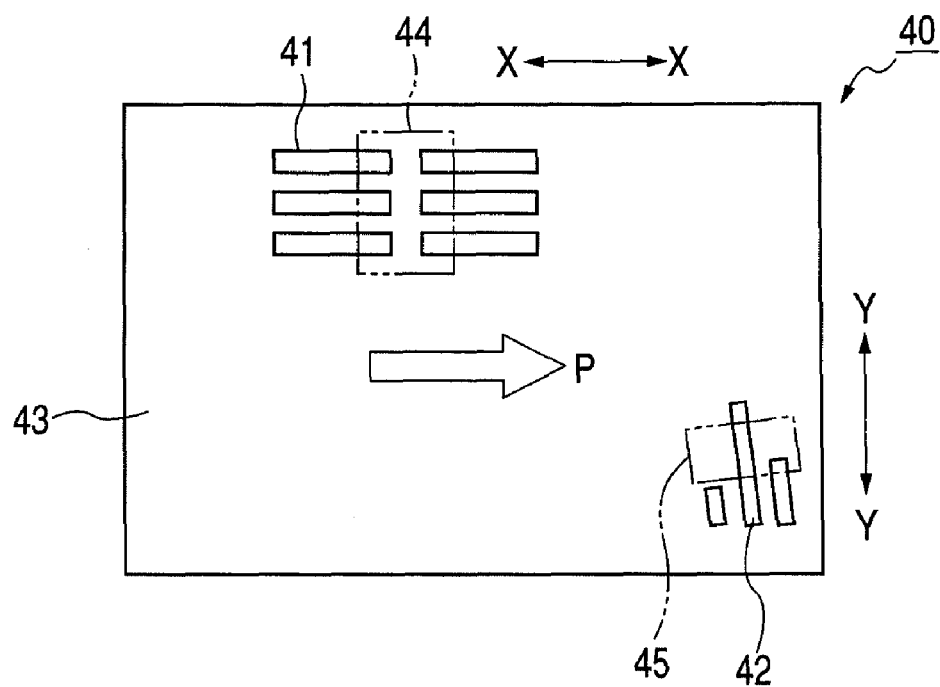
FIG. 5 is a plan view illustrating a circuit board according to a second embodiment of the invention.

In this embodiment, the movable contact sliding on the fixed contacts may be plated with silver, or it may be formed of a silver-clad material. When the movable contact is formed by plating or cladding one surface of an elastic metal plate with gold or a gold alloy, the life span of the movable contact can be further improved by the synergetic effect of the gold layer of the fixed contact and the gold alloy later of the movable contact. FIG. 5 is a plan view illustrating a circuit board according to a second embodiment of the invention. First fixed contacts 41a extending in parallel to a long side of a rectangular insulating substrate and second fixed contacts 42 extending substantially in parallel to a short side of the insulating substrate are patterned on a circuit board 40, and a non-contact region except for the first and second fixed contacts 41 and 42 is covered with a solder resist 43 formed of an insulating material. The first and second fixed contacts 41 and 42 are obtained by sequentially forming a nickel layer having a thickness of about 2 µm and a gold layer having a thickness of about 0.05 µm on a copper foil, which is a raw material, by plating. The gold layer, which is an uppermost layer of the first fixed contact 41, serves as a contact surface with a first movable contact 44, and the gold layer, which is an uppermost layer of the second fixed contact 42, serves as a contact surface with a second movable contact 45. The first movable contact 44 is mounted to a sliding-element supporting member (not shown) so as to be movable on the first fixed contact 41 in an X-X direction, and the second movable contact 45 is mounted to a sliding-element supporting member (not shown) so as to be movable on the second fixed contact 42 in a direction that is substantially parallel to a Y-Y direction. Since the number of times a contact structure including the first fixed contacts 41 and the first movable contact 44 is used is considerably larger than the number of times a contact structure including the second fixed contacts 42 and the second movable contact 45, the first movable contact 44 requiring a long life span is plated with a gold alloy, similar to the first embodiment. However, the second movable contact 45 having a shorter life span than the first movable contact 44 may be plated with a gold alloy, similar to the first movable contact 44. Alternatively, the second movable contact 45 may be plated with gold or silver, or it may be formed of a silver-clad material. In this case, manufacturing costs can be reduced.

The circuit board 40 having the above-mentioned structure is manufactured through the processes shown in FIG. 3, similar to the first embodiment. However, in this embodiment, during the buffing processes (S-2 and S-4 in FIG. 3), the buffing direction P is aligned with the sliding direction (X-X direction) of the first movable contact 44, and the buffing direction P is substantially vertical to the sliding direction (substantially in the Y-Y direction) of the second movable contact 45. As a result, in a plating process (S-6 in FIG. 3), when uneven portions occur in the gold layers, which are the uppermost layers of the first and second fixed contacts 41 and 42, due to scars caused by the buffing process, the uneven portion that occurs in the surface of the gold layer of the first fixed contact 41 does not cause the scraping of the first movable contact 44 that slides on the uneven portion. Therefore, gold plating is performed on the first and second fixed contacts 41 and 42 to prevent the abrasion of the first and second fixed contacts 41 and 42, thereby improving the reliability of electrical connection. As a result, the abrasion loss of the first fixed contact 41 and the first movable contact 44 is reduced, which makes it possible to lengthen the life span of the first fixed contact 41 and the first movable contact 44. In this case, since uneven portions occurs in the surface of the gold layer of the second fixed contact 42 in a direction substantially vertical to the sliding direction of the second movable contact 45, the abrasion loss of the second movable contact 45 sliding on the second fixed contact 42 increases slightly. However, as described above, since the second fixed contact 42 is applied to a contact structure that does not require a longer life span than the first fixed contact 41, the life span and the reliability of the entire switch device can be improved.

Figure 6:
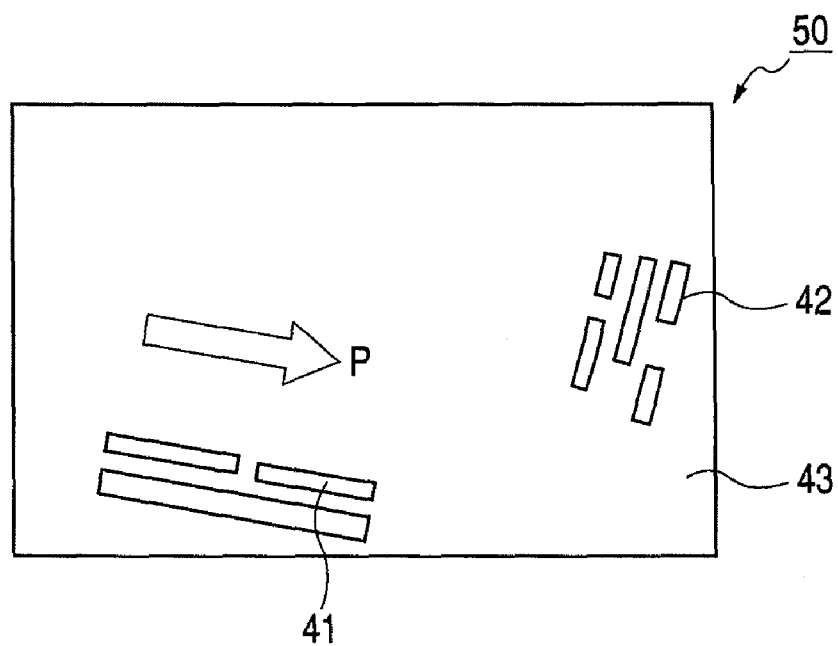
FIG. 6 is a plan view illustrating a circuit board according to a third embodiment of the invention.

FIG. 6 is a plan view illustrating a circuit board according to a third embodiment of the invention. In FIG. 6, the same components as those shown in FIG. 5 are denoted by the same reference numerals.

The structure of a circuit board 50 shown in FIG. 6 is similar to that of the circuit board 40 according to the second embodiment except that the first fixed contact 41 extends in a direction that is slightly inclined with respect to a long side of an insulating substrate. In this case, the following method may be performed to obtain a plurality of circuit boards 50: a plurality of first fixed contacts 41 are collectively patterned on the surface of a large insulating substrate so as to extend in the same direction; a buffing process is performed on the large insulating substrate with a buffing direction P being aligned with the direction in which the first fixed contacts 41 extend; a plating process is performed on the large insulating substrate; and the large insulating substrate is divided into a plurality of circuit boards 50.

Figure 7:
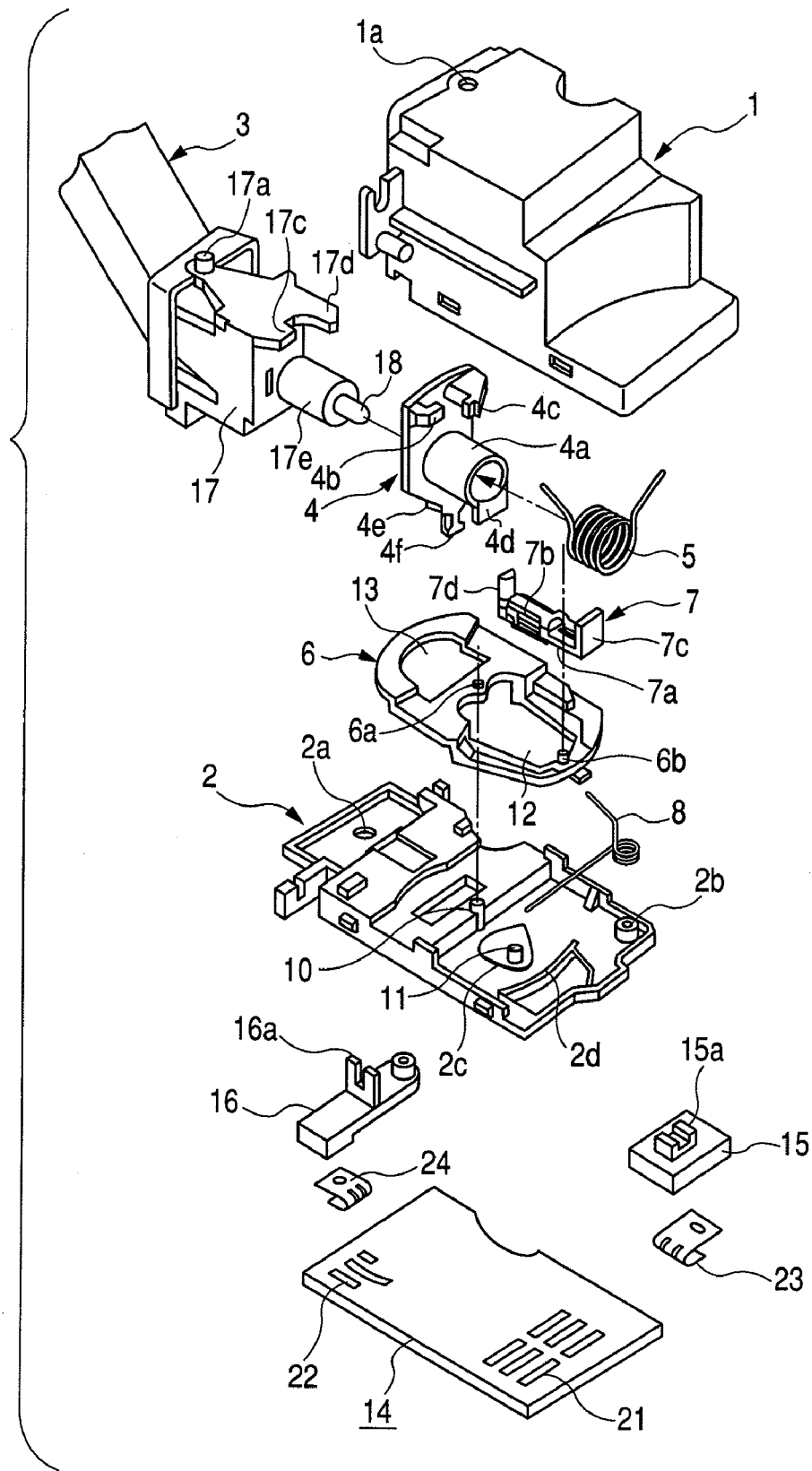
FIG. 7 is an exploded perspective view illustrating a turn signal switch device according to an embodiment of the invention.
Figure 8:
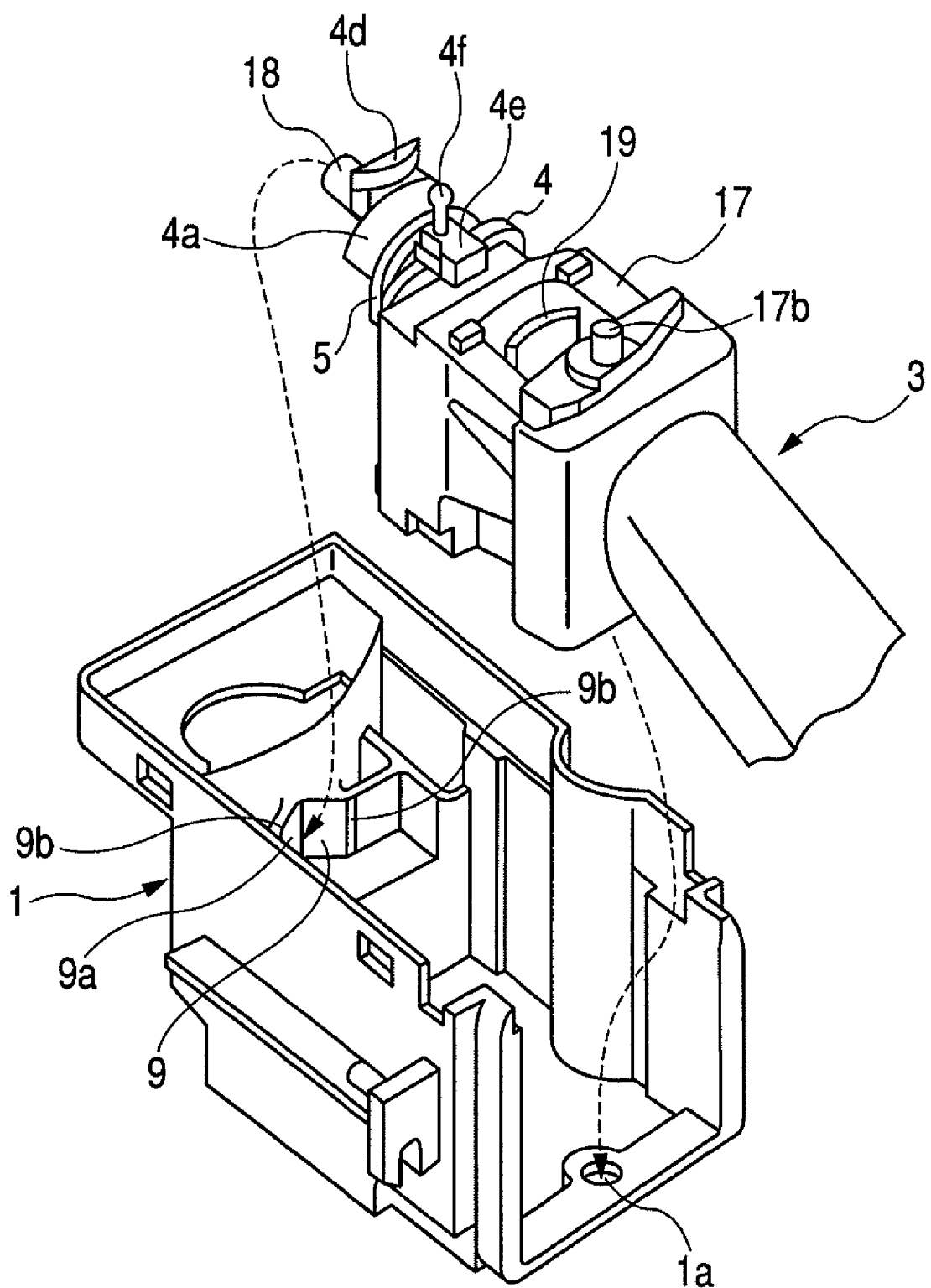
FIG. 8 is a perspective view illustrating an operating lever encased in a first case of the turn signal switch device.
Figure 9:
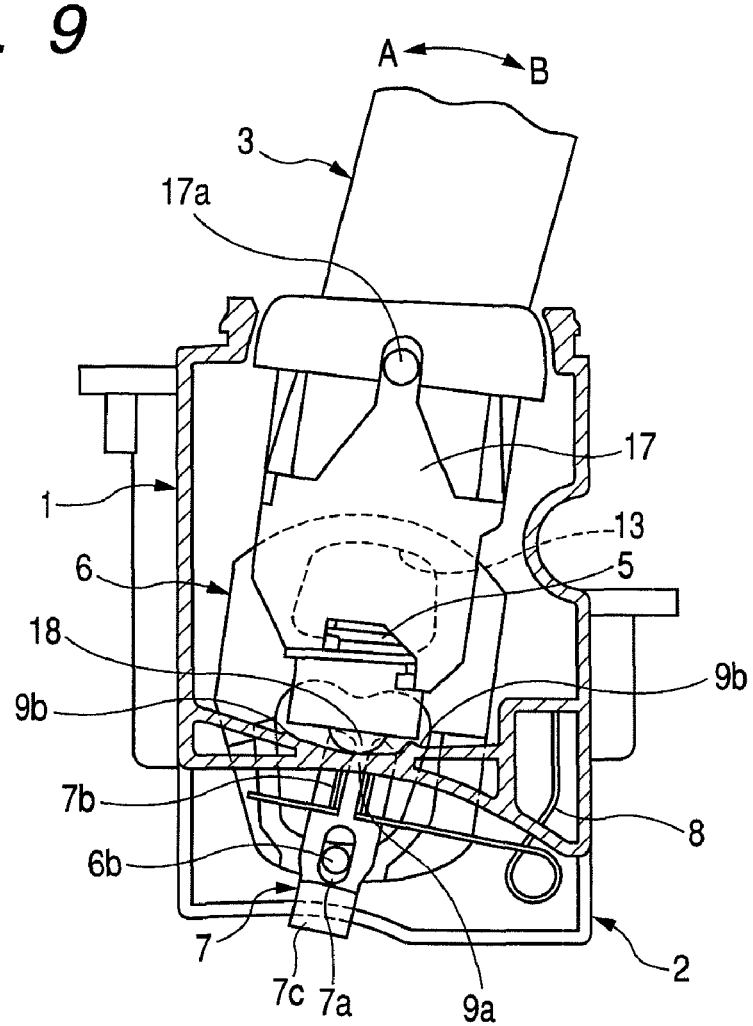
FIG. 9 is a transverse cross-sectional view illustrating the turn signal switch device.
Figure 10:
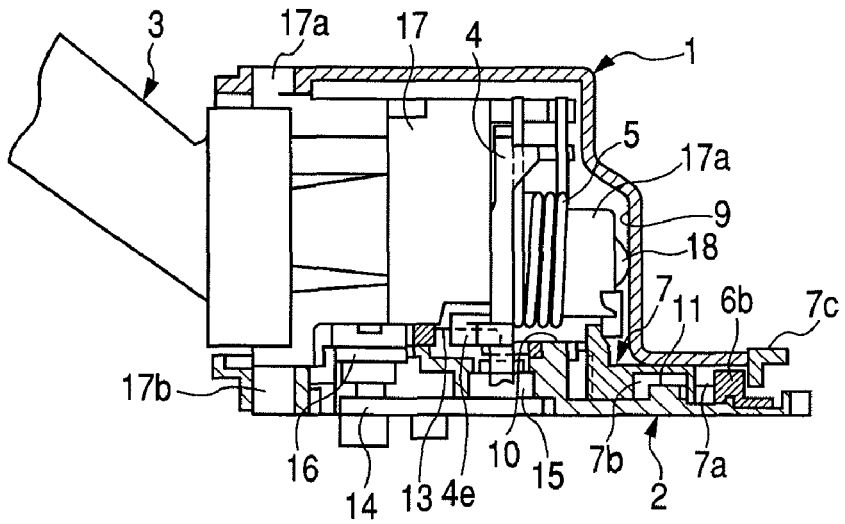
FIG. 10 is a longitudinal cross-sectional view illustrating the turn signal switch device.
Figure 11:
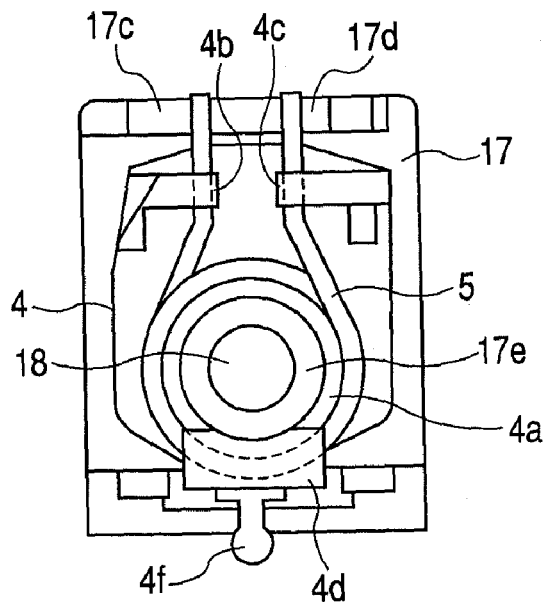
FIG. 11 is a front view illustrating a rotating member provided in the turn signal switch device.
Figure 12A:
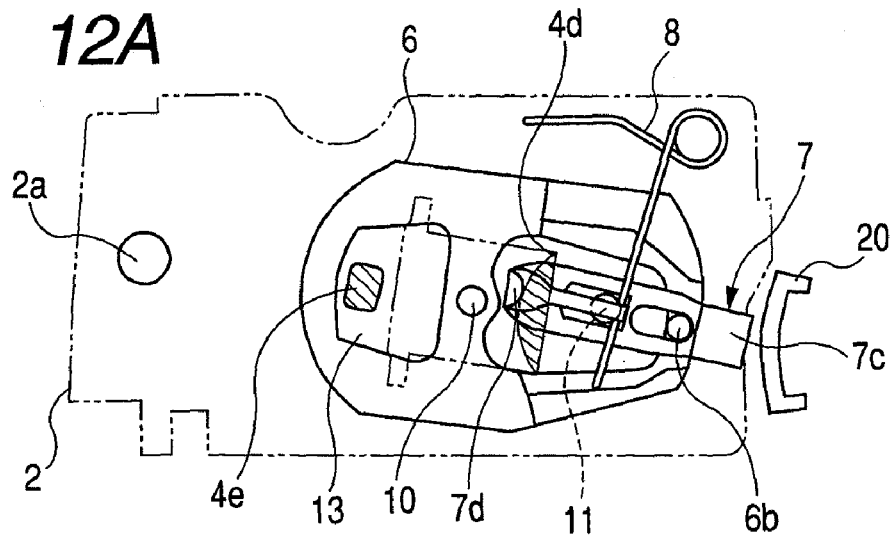
FIG. 12 is a diagram illustrating a cancel operation of the turn signal switch device.
Figure 12B:
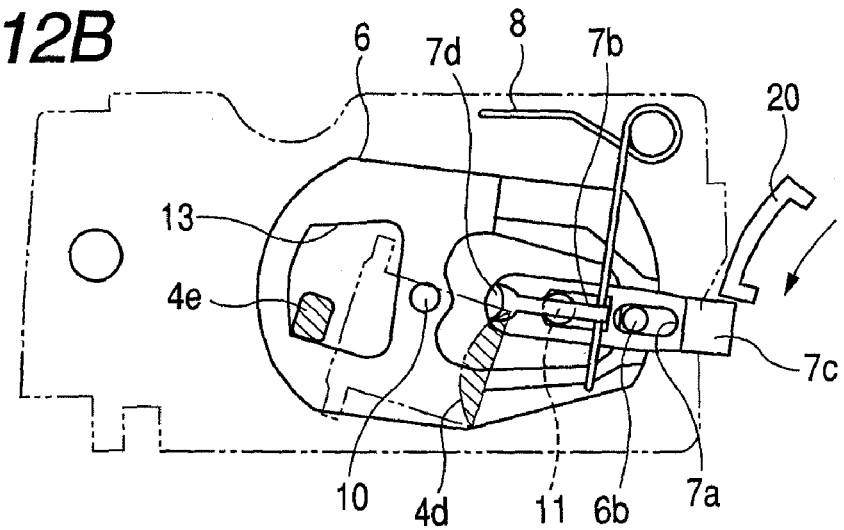

Next, a turn signal switch device to which the circuit board according to the embodiments of the invention is applied will be described with reference to FIGS. 7 to 12. FIG. 7 is an exploded perspective view illustrating a turn signal switch device according to this embodiment of the invention. FIG. 8 is a perspective view illustrating an operating level encased into a first case provided in the turn signal switch device, FIG. 9 is a transverse cross-sectional view illustrating the turn signal switch device, and FIG. 10 is a longitudinal cross-sectional view illustrating the turn signal switch device. FIG. 11 is a front view illustrating a rotating member provided in the turn signal switch device, and FIGS. 12A and 12B are diagrams illustrating a cancel operation of the turn signal switch device.

As shown in the drawings, the turn signal switch device according to this embodiment includes first and second cases 1 and 2 that are integrally coupled to each other to form a housing, an operating lever 3 that is rotatably supported by the two cases 1 and 2, a rotating member 4 that is rotatably supported by the operating lever 3, a return spring 5 that automatically returns the rotating member 4 to its central position, first and second lever members 6 and 7 that are mounted on an upper surface of the second case 2, and a twist coil spring 8 that elastically urges the second lever member 7 in a direction in which the second lever member 7 protrudes from the second case 2. The first and second cases 1 and 2 are fixed to a column cover or a stator member, such as a combination switch (not shown).

A V-shaped cam surface 9 is formed inside the first case 1, and the cam surface 9 includes a central valley portion 9a and protruding lock portions 9b provided at both sides of the valley portion 9a. The first case 1 and the second case 2 are integrated into one body by, for example, a snapping connection unit, and holes 1a and 2a, which are rotating points of the operating lever 3, are formed in the two cases 1 and 2, respectively. A first support pin 10 and a second support pin 11 are provided at a predetermined interval on the inner bottom surface of the second case 2, and a first lever member 6 is rotatably supported by the first support pin 10. A first clearance hole 12 and a second clearance hole 13 are formed in the first lever member 6, and a hole 6a to which the first support pin 10 is fitted is formed between the two clearance holes 12 and 13. In addition, a support pin 6b is provided at a leading end of the first lever member 6, and the second lever member 7 is rotatably supported by the support pin 6b.

A first long hole 7a to which the support pin 6b is fitted and a second long hole 7b to which the second support pin 11 is fitted are formed in the second lever member 7 such that the longitudinal directions of the two holes 7a and 7b are collinear. In addition, an abutting portion 7c and a cam portion 7d are formed at front and rear ends of the second lever member 7, respectively, and the cam portion 7d has a semicircular shape in sectional view. One end of the twist coil spring 8 is retained in the second lever member 7, and the twist coil spring 8 elastically urges the second lever member 7 in the longitudinal directions of the two holes 7a and 7b. A winding portion of the twist coil spring 8 is fitted to a boss 2b formed on the inner bottom surface of the second case 2, and the other end of the twist coil spring 8 is retained in the side wall of the second case 2. In addition, a step portion 2c and a rib 2d abutting on the bottom surface of the second lever member 7 are formed on the inner bottom surface of the second case 2. The step portion 2c and the rib 2d reduce contact resistance between the second case 2 and the second lever member 7.

A circuit board 14 is mounted on the bottom of the second case 2, and is substantially equivalent to the circuit board 40 according to the second embodiment. That is, first fixed contacts 21 and second fixed contacts 22 are formed on the surface of the circuit board 14 such that their extending directions are substantially orthogonal to each other, and the first and second fixed contacts 21 and 22 are plated with gold. The first fixed contact 21 is a fixed contact for a winker operation that requires a long life span, and during a buffing process, a buffing direction is aligned with a direction in which the first fixed contacts 21 extend (a direction in which a first movable contact 23, which will be described later, slides). A first sliding-element supporting member 15 and a second sliding-element supporting member 16 are provided between the bottom of the second case 2 and the circuit board 14, and the first movable contact 23 sliding on the first fixed contact 21 is provided on a lower surface of the sliding-element supporting member 15. The first movable contact 23 is formed by plating or cladding one surface of an elastic metal plate made of phosphor bronze with a gold alloy, and thus the life span of the switch device can be improved by the synergetic effect of the first fixed contact 21 plated with gold and the first movable contact 23 plated with a gold alloy. A driving support member 15a protrudes from the upper surface of the first sliding-element supporting member 15, and the driving support member 15a is exposed toward the inner bottom surface of the second case 2. The first sliding-element supporting member 15 is movable in the direction in which the first fixed contact 21 extends, and as will be described later, the first sliding-element supporting member 15 is driven by a left turn operation or a light turn operation of the operating lever 3 to turn on or off a left turn lamp or a light turn lamp (not shown) (winder operation). The second fixed contact 22 is a fixed contact for a passing operation, and the second movable contact 24 sliding on the second fixed contact 22 is provided on the lower surface of the second sliding-element supporting member 16. Since a contact structure for the passing operation does not require a longer life span than that for the winder operation, the second movable contact 24 is plated or clad with silver, considering manufacturing costs. A driving support member 1 6a is provided on the surface of the second sliding-element supporting member 16 so as to protrude therefrom, and the driving support member 16a is also exposed toward the inner bottom surface of the second case 2. The second sliding-element supporting member 16 is movable in the direction in which the second fixed contact 22 extends. As will be described later, when the operating lever 3 is operated upward, the second sliding-element supporting member 16 is driven to turn on a beam lamp (not shown) (passing operation).

A holder 17 is mounted on the operating lever 3, and support pins 17a and 17b fitted to the two holes 1a and 2a are provided on the upper and lower surfaces of the holder 17, respectively. The operating lever 3 and the holder 17 integrally rotate in the horizontal direction on a rotating axis linking the two holes 1a and 2a (two support pins 17a and 17b) in a straight line. The operating lever 3 is connected to the holder 17 such that it can rock by a predetermined angle in the vertical direction of the holder 17 by a beam driving mechanism (not shown). A pair of spring bearings 17c and 17d are formed on the upper surface of the holder 17, and a cylindrical portion 17e is formed on a front surface of the holder 17. A driving member 18 is slidably provided inside the cylindrical portion 17e, and a leading end of the driving member 18 is brought into pressure contact with the cam surface 9 of the first case 1 by a spring (not shown) at all times.

The cylindrical portion 17e of the holder 17 is fitted to a tubal member 4a formed on the rotating member 4, and the rotating member 4 is rotatably maintained in the holder 17 using the cylindrical portion 17e as a guide surface (see FIG. 11). A pair of spring bearings 4b and 4c are formed at an upper part of the rotating member 4, and both ends of the return spring 5 wound around the tubal member 4a are retained in the two spring bearings 4b and 4c and the two spring bearings 17c and 17d of the holder 17, so that the rotating member 4 is urged toward the central position at all times. In addition, a cam portion 4d extends downward from the lower end of the tuba member 4a in a semicircular shape in sectional view. The cam portion 4d is opposite to the cam portion 7d of the second lever member 7. In addition, a driving portion 4e extends downward from the lower end of the rotating member 4 to reach the second clearance hole 13 of the first lever member 6, and a protrusion 4f engaged with the driving support member 15a of the first sliding-element supporting member 15 is formed on the driving portion 4e. A protrusion 19 is formed at a lower end of the operating lever 3, and the protrusion 19 is engaged with the driving support member 16a of the second sliding-element supporting member 16.

Next, the operation of the turn signal switch device having the above-mentioned structure will be described below. First, as shown in FIG. 9, when the operating lever 3 is at a neutral position, the driving member 18 is stably maintained at a predetermined position by the elasticity of a spring (not shown) with the leading end thereof abutting on the central valley portion 9a of the cam surface 9. At that time, as shown in FIG. 12A, the cam portion 4d of the rotating member 4 and the cam portion 7d of the second lever member 7 come into contact with each other at their vertexes, and the second lever member 7 is urged backward by the urging force of the twist coil spring 8. The abutting portion 7c of the second lever member 7 is disposed outside the rotating locus of a cancel protrusion 20 provided in a rotor that rotates so as to be operatively associated with the rotation of a steering wheel. Therefore, even when the steering wheel rotates in this state, the cancel protrusion 20 does not contact with the abutting portion 7c of the second lever member 7, and the operating lever 3 is kept at the neutral position.

When the operating lever 3 is operated from the neutral position to the direction of an arrow A or B as shown in FIG. 9, the leading end of the driving member 18 goes up an inclined plane of the cam surface 9 and is then engaged with the lock portion 9b. As a result, the driving member 18 is stably maintained at a predetermined position by the lock portion 9b. For example, when the operating lever 3 is operated in the direction of the arrow B in FIG. 9, the rotating member 4 operatively associated with the operating lever 3 is rotated, and the cam portion 4d and the driving portion 4e that are hatched in FIG. 12 are displaced from a position shown in FIG. 12A to a position shown in FIG. 12B. As a result, the cam portion 4d of the rotating member 4 deviates from the vertex of the cam portion 7d of the second lever member 7, and the elastic force of the twist coil spring 8 is applied to the second lever member 7 such that the second lever member 7 moves forward along the longitudinal direction of the two long holes 7a and 7b and the abutting portion 7c advances within the rotating locus of the cancel protrusion 20. In addition, when the operating lever 3 is operated in the direction of the arrow B, the protrusion 4f provided at the lower end of the rotating member 4 moves the first sliding-element supporting member 15. Therefore, the first movable contact 23 mounted on the lower surface of the first sliding-element supporting member 15 slides on the first fixed contact 21, so that contact switching is performed. As a result, a right turn signal lamp (not shown) is turned on and off.

When the steering wheel rotates in the opposite direction (in the direction of the arrow in FIG. 12B) with the operating lever being disposed at a right turn position shown in FIG. 12B, the cancel protrusion 20 comes into contact with the abutting portion 7c of the second lever member 7 during the return operation. As a result, the second lever member 7 rotates on the second support pin 11 in the clockwise direction of FIG. 12B, and then the first lever member 6 having the support pin 6b that is fitted to the first long hole 7a rotates on the first support pin 10 in the clockwise direction. Therefore, the second clearance hole 13 of the first lever member 6 rotates upward in FIG. 12B. Then, the periphery of the second clearance hole 13 presses the driving portion 4e of the rotating member 4 upward, so that the driving member 18 deviates from the lock portion 9b of the cam surface 9 and moves to the central valley portion 9a. As a result, the operating lever 3 and the first and second lever members 6 and 7 are automatically returned to the neutral position shown in FIG. 12A.

When a user rotates the steering wheel in the opposite direction while pressing the operating lever 3 in the state shown in FIG. 12B, as described above, the periphery of the second clearance hole 13 presses the driving portion 4e of the rotating member 4, but the operating lever 3 is not automatically returned to the neutral position since it is being pressed. In this case, the rotating member 4 resists the elastic force of the return spring 5 and rotates around a circumferential surface of the cylindrical portion 17e. When the cancel protrusion 20 passes through the abutting portion 7c of the second lever member 7, the rotating member 4 is automatically returned to the central position of the holder 17 by the return spring 5, so that the operating level 3 is maintained at the right turn position shown in FIG. 12B. As described above, since the rotation of the first lever member 6 accompanied by the cancellation operation is absorbed by the rotation of the rotating member 4, it is possible to prevent the damage of constituent parts of a power transmission system including the two levers 5 and 6 and the driving portion 4e. In addition, when the steering wheel is further rotated in the clockwise direction with the operating lever being disposed at the right turn position shown in FIG. 12B, the cancel protrusion 20 comes into contact with the abutting portion 7c of the second lever member 7 in the opposite direction of the arrow shown in FIG. 12B, and the second lever member 7 and the first lever member 6 rotate in the counterclockwise direction on the contrary to the cancel operation. In this case, the cam portion 7d of the second lever member 7 rotatably slides on the peripheral surface of the cam portion 4d of the rotating member 4 smoothly, and the first lever member 6 rotates in the direction in which the periphery of the second clearance hole 13 is separated from the driving portion 4e. As a result, the operating lever 3 is maintained at the right turn position without being returning to the neutral position.

When the operating lever 3 is operated from the neutral position to the upper side, the operating lever 3 rocks in the vertical direction of the holder 17 by a beam driving mechanism (not shown), and the protrusion 19 provided at the lower part of the operating lever 3 moves the second sliding-element supporting member 16. Then, the second movable contact 24 provided on the lower surface of the second sliding-element supporting member 16 slides on the second fixed contact 22, so that contact switching is performed. As a result, a beam lamp (not shown) is turned on.

In the turn signal switch device according to this embodiment, the first fixed contact 21 for a winker operation and the second fixed contact 22 for a passing operation are provided on the same surface of the circuit board 14. When the surface of a copper foil, which is a raw material forming the first and second fixed contacts 21 and 22, is polished with buff, the buffing direction is substantially aligned with the direction in which the first movable contact 23 slides on the first fixed contact 21. As a result, it is possible to lengthen the life span of a contact structure for a winker operation that is more frequently used than a contact structure for a passing operation, and thus provide a turn signal switch device having high reliability of electrical connection and a long life span.

In the above-described embodiment, the first fixed contact 21 for a winker operation and the second fixed contact 22 for a passing operation are provided on the circuit board 14 so as to be substantially orthogonal to each other. However, the first and second fixed contacts may extend in the same direction, that is, the first and second movable contacts may slide in the same direction. In this case, the buffing direction may be aligned with the sliding direction of the first and second movable contacts. When both the first and second movable contacts are formed of a gold alloy, it is possible to lengthen the life span of both a contact structure for a passing operation and a contact structure for a winker operation.

Further, in the above-described embodiments of the invention, the circuit board is applied to a turn signal switch device, but the invention is not limited thereto. For example, the circuit board according to the embodiments of the invention can be applied to a switch device that has fixed contacts formed in a copper foil pattern and requires a long life span, such as a switch device for gearshift.

The invention claimed is:

1. A method of manufacturing a circuit board having fixed contacts on which a movable contact slides, comprising:
    etching a copper foil formed on the entire surface of an insulating substrate to form the pattern of the fixed contact;
    polishing the surface of the copper foil with buff in a buffing direction; and
    sequentially forming a nickel layer having a thickness of about 1 to about 5 µm and a gold layer having a thickness of about 0.01 µm to about 0.5 µm on the fixed contacts,
    wherein the movable contact slides in a sliding direction, the sliding direction being a linear direction,
    wherein the fixed contacts extend in the sliding direction; and
    wherein the buffing direction is substantially aligned with the sliding direction of the movable contact.

2. The method of manufacturing a circuit board according to claim 1, wherein the movable contact is formed by one of plating or cladding one surface of an elastic metal plate with a gold alloy.

3. A method of manufacturing a circuit board having first and second fixed contacts formed on the same surface, first and second movable contacts respectively sliding on the first and second fixed contacts so as to be substantially orthogonal to each other, comprising:
    etching a copper foil formed on the entire surface of an insulating substrate to form the patterns of the first and second fixed contacts;
    polishing the surface of the copper foil with buff in a buffing direction; and
    sequentially forming a nickel layer having a thickness of about 1 to about 5 µm and a gold layer having a thickness of about 0.01 to about 0.5 µm on each of the first and second fixed contacts, wherein the first and second movable contacts slide in a sliding direction, the sliding direction being a linear direction, wherein the first and second fixed contacts extend in the sliding direction, and wherein the buffing direction is substantially aligned with the sliding direction.

4. The method of manufacturing a circuit board according to claim 3, wherein the first fixed contact is a contact for a winker operation of a turn signal switch device, and the second fixed contact is a contact for a passing operation of the turn signal switch device.

* * * * *